United States Patent [19]
Terry

[11] 4,204,155
[45] May 20, 1980

[54] AUTOMATIC FOUR-POINT PROBE
[75] Inventor: Malvin D. Terry, Phoenix, Ariz.
[73] Assignee: Advanced Semiconductor Materials/America, Phoenix, Ariz.
[21] Appl. No.: 928,994
[22] Filed: Jul. 28, 1978
[51] Int. Cl.$^2$ .................. G01R 31/02; G01R 27/14
[52] U.S. Cl. .................. 324/158 F; 324/64; 324/158 P
[58] Field of Search .......... 324/158 F, 158 P, 64, 324/72.5; 269/321 WE, 21; 318/569, 685

[56] References Cited

U.S. PATENT DOCUMENTS

| | | | |
|---|---|---|---|
| 3,134,064 | 5/1964 | Narbro | 340/203 |
| 3,333,274 | 7/1967 | Forcier | 324/158 P |
| 3,437,929 | 4/1969 | Glenn | 324/158 F |
| 3,996,517 | 12/1976 | Fergason et al. | 324/158 P |

*Primary Examiner*—Rudolph V. Rolinec
*Assistant Examiner*—Ernest F. Karlsen
*Attorney, Agent, or Firm*—William H. Drummond

[57] ABSTRACT

An automatic four-point probe mechanism, containing various sensors, motors, and precision machine parts necessary to accurately and repeatedly lower a four-point resistivity head onto a semi-conductor slice surface is ideally suited for operator independent measurements of semi-conductor resistivity. The automatic four-point probe finds application in quality assurance incoming-outgoing inspections, materials process control, epitaxial in-process control, diffusion in-process control, thin-film process control, and similar applications. In the preferred embodiment, all torsional forces are eliminated from the probe head, thus avoiding scratch damage to the semi-conductor surface and providing for uniform depth penetration of the probe into the semi-conductor surface and great repeatability of test readings.

1 Claim, 4 Drawing Figures

AUTOMATIC FOUR-POINT PROBE

This invention relates to an improved automatic four-point probe apparatus for making resistivity measurements of semi-conductor materials. In another respect, the invention relates to an improved mechanical train for raising and lowering a resistivity measurement probe to and from the surface of a semi-conductor material whereby all torsional stresses on the probe head are avoided.

In still another respect, the invention relates to the placement of a four-point probe against the surface of a semi-conductor so as to assure uniform pressure and depth of penetration which is operator independent.

In yet another respect, the invention relates to apparatus for use with four-point probe resistivity measurements in which all measurements are initiated at the same location thereby increasing the repeatability of the measurement readings obtained.

In another important respect, the invention relates to an automatic four-point probe semi-conductor resistivity measurement device in which the location (R-theta) of the measurement on the surface of the semi-conductor material is precisely controlled and operator independent.

Prior art semi-conductor resistivity measurements were plagued by lack of repeatability or uniformity. A primary factor in the imprecision of such measurements was that such operations were operator-dependent, that is, the measurement results vary from operator to operator, or given a single operator, the results varied hour to hour and day to day. In prior art operations, under manual control of the operator, it is essentially impossible to obtain uniform depth of penetration of the semi-conductor surface by the resistivity probe. In addition to variations in pressure and depth of penetration, manual operations also produce torsional stresses on the probe head assembly and frequently cause scratching of the semi-conductor surface, all of which affected the accuracy and repeatability of the measurement being taken. Because the location at which the measurement was to be taken was subject to the manual control of the operator, a loss of repeatability of such measurements was further assured.

It would therefore be desirable to provide a mechanism for making four-point probe resistivity measurements of semi-conductor material which is free of the vagaries of operator manual control. It would be particularly desirable to provide a mechanism which yields precise, repeatable measurements, eliminates torsion stresses on the probe and locates the probe with repeatable accuracy on the surface of the semi-conductor material.

Accordingly, the principal object of the invention is to provide a precision mechanism for locating and placing a four-point resistivity probe head on the surface of a semi-conductor material.

Another principal object of the invention is to place the resistivity probe in contact with the semi-conductor material in such a way as to eliminate all torsional stresses on the probe.

It is a still further and more specific object of the invention to provide a probe mechanism which is operator independent and inherently repeatable as to pressure, depth of penetration and placement of the probe head with respect to the semi-conductor material.

These and other objects and advantages of the invention will be apparent to those skilled in the art from the following detailed description thereof, taken in conjunction with the drawings, in which.

Figure 1:
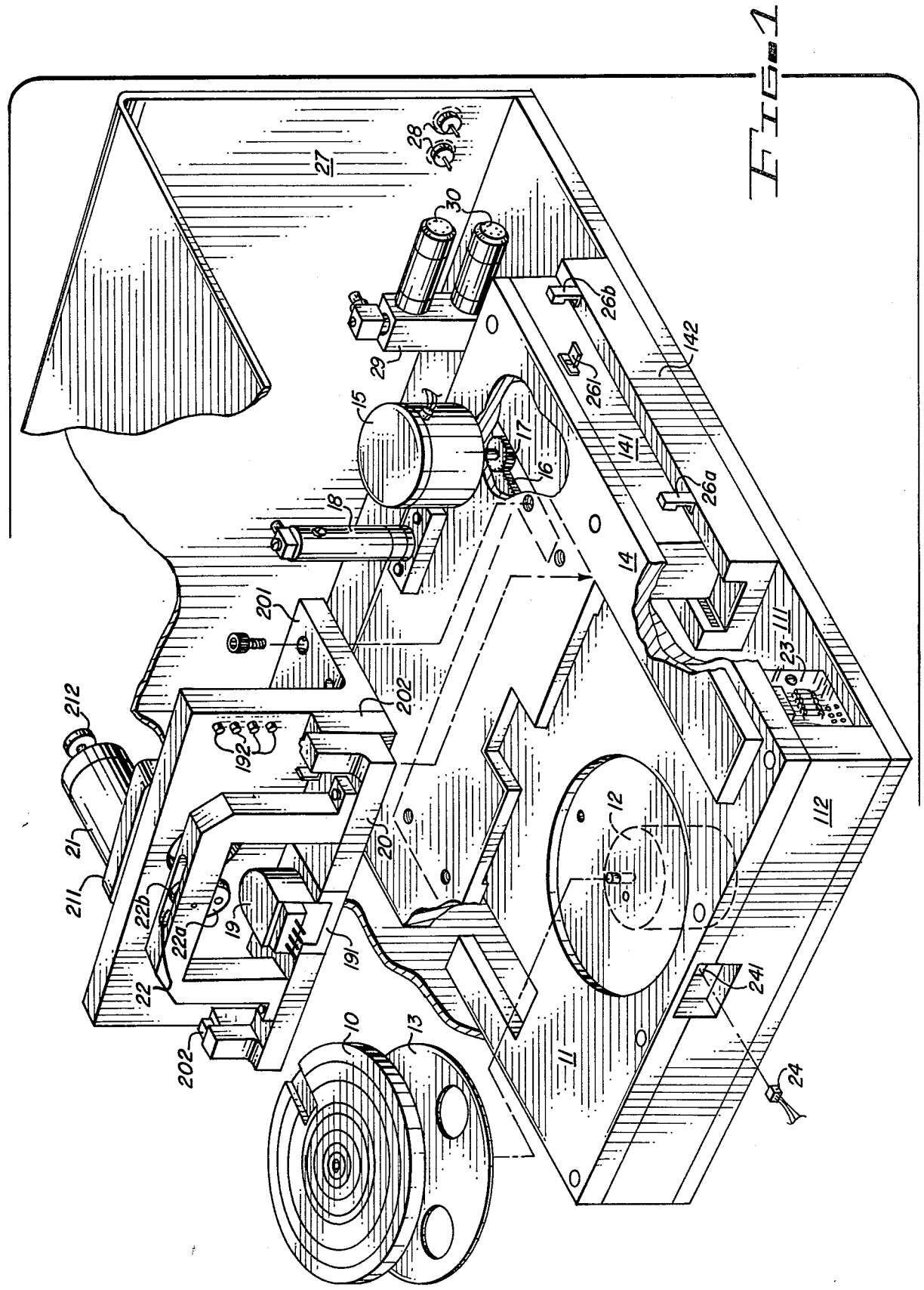
FIG. 1 is an exploded perspective view of the probe mechanism having mechanical linkages constructed in accordance with the presently preferred embodiment of the invention.

Briefly, the invention discloses a mechanism for handling semi-conductor material and locating a resistivity probe and then placing it on that semi-conductor material for purposes of making resistivity measurements. It is this mechanism which provides the highly precise, operator-independent resistivity measurements derived from use of the invention. In operation, electrical control signals are derived or provided, however the actual control circuits utilizing or generating such signals are not disclosed since their selection is a matter of the designer's choice. Such control circuits could be simple pushbutton-type control sequences or sophisticated microprocessing units providing fully automatic control.

In accordance with the invention, I provide a probe mechanism having a vacuum chuck to hold semi-conductor materials which chuck is rotatable and indexed so that its position may be sensed and determined at any given time. Means for supporting and locating a resistivity probe head above the semi-condutor material in said vacuum chuck is provided, said locating means comprising a driven cam-follower assembly to raise and lower the probe above the semi-conductor material and a rack and pinion driven assembly for lateral movement of the probe. Sensor means are provided for tracking both the vertical and horizontal motion of the probe head. The rotation of the vacuum chuck, the elevation of the probe head and its lateral position are all independent of the manual dexterity of the operator. The externally controlled drives coupled with position sensors provide a precision probe mechanism heretofore unavailable in the art.

According to a presently preferred embodiment of the invention, the vacuum chuck is rotatably embedded within a deck plate through which the shaft of a stepping motor is passed and affixed to said vacuum chuck, thereby providing the means to rotate said chuck. Interspersed between the vacuum chuck and the deck plate is a vacuum disc which provides means to hold the vacuum chuck in a fixed position during those times when a measurement is being performed. Slidably positioned above said deck plate is the probe platen. A DC stepper motor is affixed to the platen and coupled by its shaft to a rack and pinion drive such that rotation of the shaft of the stepper motor causes the platen to move slidably above the deck plate.

Affixed, also, to the probe platen is an air-operated brake cylinder having an extensible cylinder arm to which a pressure pad is attached. When the cylinder is actuated, the cylinder arm extends through a bore in the probe platen causing the pressure pad to bear forcibly against the surface of the deck plate, thereby inhibiting any sliding motion of the deck plate. The brake cylinder is actuated when a measurement is initiated to inhibit any lateral motion of the probe head while it is in contact with the semi-conductor material surface.

The resistivity probe is affixed to a probe carriage assembly which is slidably fastened to the probe platen so that a vertical motion may be imparted to the probe head. Motive means for imparting motion in said vertical plane is derived from a gear motor driving a cam/cam-follower arrangement which is an integral part of the probe carriage assembly. Care is taken that the driving force to impart such vertical motion is applied in a plane passing directly through the center of the resistivity probe so as to prevent the generation of torsional forces on the resistivity probe. The inhibition of torsional forces on the probe prevents scratching of the semi-conductor surface and greatly increases repeatability in the measurement readings taken with the aid of the invention.

An important feature which contributes to the accuracy of the measurements made with the invention is that all measurements are initiated from the same position. To this end, sensors are provided to detect limit positions of the vacuum chuck, the gear motor which drives the probe head in the vertical plane, and the probe platen which moves to provide lateral displacement of the probe head. When a measurement is initiated, the various drives are energized until the sensor detects that the limit has been reached. At that point, the head is lowered to contact the surface of the semi-conductor material and the measurement reading is made.

Figure 2:
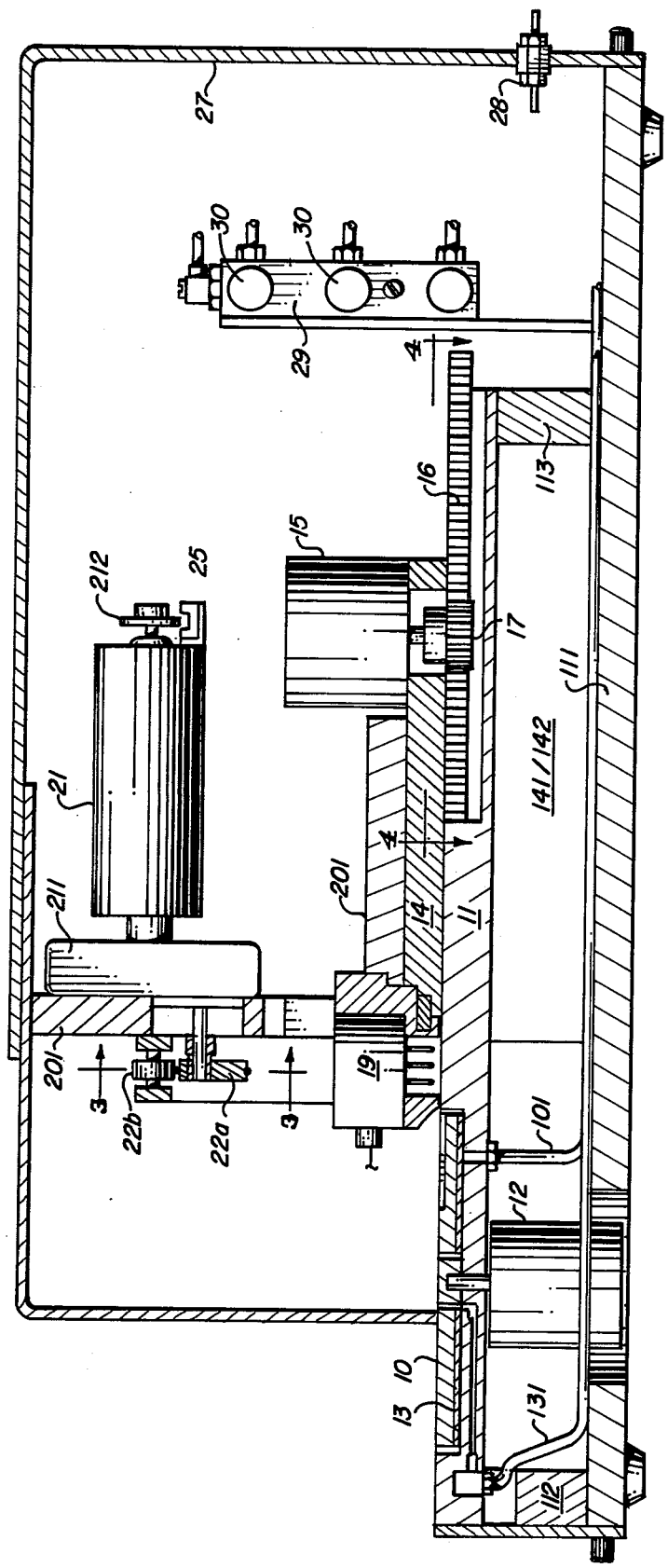
FIG. 2 is a sectional right-end elevation view of the probe mechanism showing particularly the mode of operative association of the mechanical linkages of FIG. 1.

Turning now to the drawings, in which the presently preferred embodiment of the invention is shown for purposes of illustration, it should be noted that in all figures, like-reference characters represent identical elements. The general arrangement of the various elements of the four-point probe mechanism are best appreciated by observing both FIGS. 1 and 2 in conjunction with the following discussion. Vacuum chuck 10 provides the work surface upon which the semi-conductor material is placed preparatory to making resistivity measurements. A vacuum line 101, FIG. 2, provides the necessary vacuum between the chuck plate and the semi-conductor material to maintain the semi-conductor in place during the course of the measurements. Vacuum chuck 10 is rotatably recessed within the surface of deck plate 11. Chuck 10 is affixed to the shaft of DC stepping motor 12 which, when energized, causes rotation of the chuck. Interspersed between vacuum chuck 10 and deck plate 11 is vacuum disc 13. Vacuum disc 13, in conjunction with vacuum line 131, FIG. 2, provides the means to secure vacuum chuck 10 in stable position during the course of the resistivity measurement. Deck plate 11 is suspended above base plate 111 by mounting blocks 112 and 113.

A slidably, movable surface is provided by probe platen 14. Probe platen 14 is free to slide above deck plate 11. A precision slide motion is assured by affixing platen 14 to ball slide block 141 which is guided by the way supplied by ball slide 142. For clarity of illustration, only one of two ball slide assemblies 141/142 is shown in FIg. 1. Ball slide 142 is affixed to base plate 111. The sliding impetus is provided to probe platen 14 by energization of stepping motor 15. Stepping motor 15 is affixed to platen 14. Antibacklash pinion 17, which is affixed to the shaft of stepping motor 15, engages rack 16 which is fastened to deck plate 11. As pinion 17 rotates down the length of rack 16, a sliding motion is imparted to probe platen 14. As will be seen, this sliding motion is used to determine the radial position of the resistivity probe head with respect to the center of vacuum chuck 10. Probe platen 14 is provided with a brake cylinder 18, which when energized drives a pressure pad through an opening in platen 14, whereby the pressure pad is caused to bear against the surface of deck plate 11 and hold platen 14 in immobile position. This immobility of the probe platen is maintained during each measurement taken while the probe head is in contact with the semi-conductor material.

Figure 3:
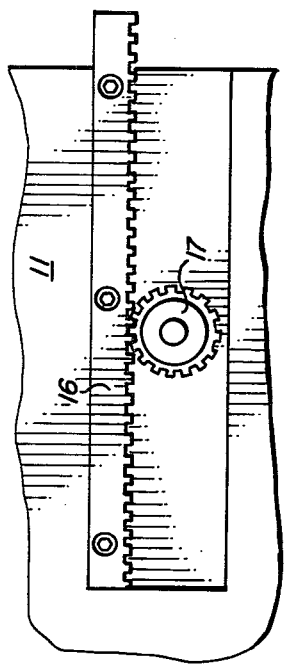
FIG. 3 is a sectional view of a portion of FIG. 2 showing the cam follower arrangement utilized to raise and lower the probe head.
Figure 4:
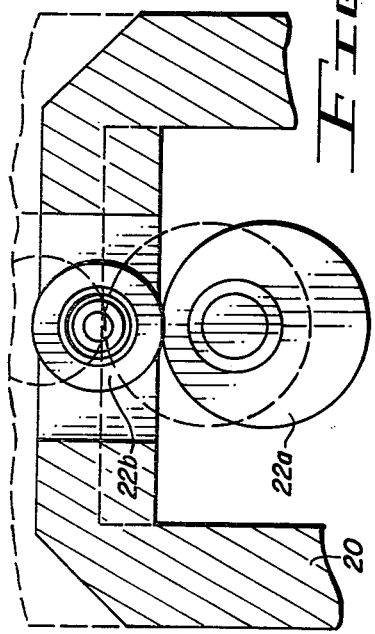
FIG. 4 is another sectional view of a portion of FIg. 2 which shows the operative association of the rack and the pinion to laterally position the probe head above semi-conductor material.

Resistivity probe head 19 is mounted in probe block 191. Probe block 191 may be adapted to accept non-standard resistivity probe heads, thereby increasing the versatility of the invention. Probe block 191 is supported by probe carriage 20. Probe carriage 20 is slidably fastened to angle plate 201 by means of ball slide assemblies 202. Ball slide assemblies 202 assure the precision motion of probe head 19 in the vertical plane. The necessary driving force for imparting this vertical motion is derived from DC motor 21. The shaft of motor 21 is coupled through gear reduction box 211 to cam/cam-follower assembly 22. As may be seen from inspection of FIGS. 2 and 3, the rotation of cam 22a causes the vertical displacement of the shaft of cam follower 22b. The shaft of cam follower 22b is rotatably connected to probe carriage assembly 20. Thus, the vertical motion imparted to the shaft of cam follower 22b is transmitted to the probe carriage 20 and probe head 19. As may be observed from FIG. 2, the motion vector imparted by the cam/cam-follower assembly 22 passes directly through the center of probe head 19. This, in conjunction with the precision ball slide assemblies 202, assures that no torsional stresses will be imparted to probe head 19.

Angle plate 201 is mounted atop probe platen 14 where the horizontal sliding action of ball slide assemblies 141/142, and the vertical action of ball slide assemblies 202 combine to provide both lateral and vertical movement of the resistivity probe head. The probe head conductors are coupled through banana plug sockets 192 on the face of angle plate 201 and are then routed to a terminal board such as shown in FIG. 1 as element 23. Conductors from terminal boards such as 23 are connected to the equipment associated with the four-point probe mechanism for purposes of converting the measurements made at the probe head to meaningful units of resistance and resistivity. Similarly, control signals for the various motors will pass through such terminal boards while sensor signals derived within the probe are outputted in the same manner.

As noted earlier, sensors are provided to maintain control of the rotational position of vacuum chuck 10 and of both the elevation and lateral displacement of probe head 19. Reflective sensor 24 is mounted in sensor port 241 so as to permit sensor 24 to detect a reflective index mark at the edge of the rotating vacuum chuck 10. The index mark is provided so that all measurements will begin with the vacuum chuck in an established position. Each time a current step is applied to stepper motor 12, its shaft, and therefore vacuum chuck 10 which is coupled thereto, will rotate 1.8°. By indexing the position of the vacuum chuck at the beginning of each measurement cycle and then maintaining track of the number of stepping current pulses applied, the total rotation of the vacuum chuck and any semi-conductor material affixed thereto will be known.

Gear bank 212 is affixed to a rearward extension of the shaft of gear motor 21. Reflective sensor 25, FIG. 2, is mounted in a manner which permits its detecting reflective index marks on the edge of gear blank 212 as the shaft of motor 21 rotates. Index marks may be provided at the edge of gear blank 212 such that sensor 25 outputs a signal when probe head 19 is at the high/low limits of its vertical excursion. These sensor signals are utilized to place the probe head at its highest position while the semiconductor material is being implaced on vacuum chuck 10 and during those periods of time between measurements when vacuum chuck 10 is rotating and/or probe head 19 is being translated in a lateral direction. The lower-limit sensor output provides for repeatable contact with the semi-conductor surface, assuring accurate and repeatable probe penetration of the semi-conductor surface for precise, repeatable measurements.

When a measurement is initiated, the lateral position of the probe is indexed so that the measurement will start at a point on the semi-conductor material corresponding to the center of vacuum chuck 10. To this end, optical switches 26a and 26b are provided adjacent ball slide block 141. A sensor flag 261, mounted to the side of ball slide block 141, causes optical switches 26a and 26b to output signals as movement of probe platen 14 and slide block 141 causes sensor flag 261 to traverse the sensor positions at which optical switches 26a and 26b are positioned. The position of optical switch 26a is that which, when it senses the presence of sensor flag 261, de-energizes the drive provided by stepper motor 15 and causes probe head 19 to be positioned directly above the center of vacuum chuck 10. In a similar manner, optical switch 26b is located to cause probe head 19 to be moved to its rearmost lateral position at the conclusion of the measurement cycle.

To preclude the possibility that motor drive currents will adversely affect the accuracy of the measurements by contributing noise thereto, all motors are de-energized while the probe measurement is being made. With no drive applied to stepper motor 12 and stepper motor 15, vacuum chuck 10 and probe platen 14 would be free to move. Such undesired motion would adversely affect the measurement being made and could possibly cause damage to the surface of the semi-conductor material. To prevent such unwanted motion, vacuum is applied to vacuum line 131, causing vacuum chuck 10 to be drawn down against vacuum disc 13 and held immobile. Similarly, brake cylinder 18 is exercised, causing it to extend its piston, with pressure pad attached, down against the surface of the deck plate and therefore prevent any lateral motion of probe plate 14. When the stability of vacuum chuck 10 and probe platen 14 are assured, drive is removed from stepper motors 12 and 15. Although drive is also removed from gear motor 21 at the time a measurement is made, no special provision is required to prevent the free rotation of the shaft of motor 21 since there is insufficient pressure at the probe head to drive back through gear reduction box 211 to cause rotation of the shaft of motor 21.

The probe mechanism is protected with a cover 27 through the walls of which hose fittings such as 28 are passed to provide the necessary air and vacuum line connections. Manifold assemblies such as 29 are employed and subjected to the control of electric valves 30 so as to sequence the application of air and vacuum to the various components of the probe assembly, as discussed above.

In its ready-for-test mode, the probe is at its highest elevation and laterally displaced to its rearmost position. Vacuum chuck 10 has been rotated to its designated start position. The probe is now ready to accept semi-conductor material for testing. To initiate a test, a semi-conductor wafer is placed atop vacuum chuck 10 and the vacuum applied to adhere the semi-conductor material to the surface of vacuum chuck 10. Probe platen 14 is then advanced to the index point which places probe head 19 directly over the center of vacuum chuck 10. Probe carriage assembly is then lowered, which brings the probe head in contact with the semi-conductor material. The vacuum is applied to maintain vacuum chuck 10 in its present position and air is applied to the brake 18 to hold probe platen 14 immobile. Motor drive is removed from motors 12, 15 and 21, and the resistivity measurement is made. In accordance with the type of measurement being made, the probe head is now raised to its highest position above the semi-conductor material, the probe platen is repositioned, and the vacuum chuck is rotated. The measurement cycle is then repeated for the new test position on the semi-conductor material, again with all motor drives removed and platen and vacuum chuck held immobile. Because all movement of the semi-conductor material and the probe head is accomplished in accordance with externally generated control signals, as earlier indicated, the resistivity measurements are operator independent. Because the position at which each series of measurements is initiated is determined by index marks or sensor flags in cooperation with various sensor devices, each measurement undertaken exhibits extreme repeatability. The mechanical linkage by which the probe head is supported and transported avoids the application of any torsional stresses on the probe head, reducing the possibility of damaging the surface of the semi-conductor wafer and increasing the accuracy of the measurements made. Because of the known characteristics of DC stepper motors 12 and 15 and of rack and pinion drive 16/17, the location (R— theta) may be determined and tracked, as well as repeated, during the course of any series of measurements.

Having described my invention in such a clear and concise manner as to enable those skilled in the art to understand and practice it, and having described a presently preferred embodiment thereof,

I claim:

1. In an automatic mechanism for locating an electrical measurement probe and placing it in contact with a flat substrate on which electrical measurements are to be made, said mechanism including
  a base,
  a rotatable support for said substrate carried by said base,
  a carriage for said probe carried by said base,
  electrical stepper motor means for moving said carriage relative to said substrate support and for rotating said substrate support,
  cam means carried on said probe carriage for moving said probe vertically relative to said substrate support, and
  means for automatically controlling said stepper motor means and said cam means to automatically position said probe on said substrate at preselected locations, the improvements whereby torsional and lateral forces between said probe and said substrate and electrical interference with said measurements are inhibited, comprising:

(a) means for de-energizing said stepping motor means when said probe is positioned at each of said preselected locations;

(b) brake means for preventing rotation of said substrate support and movement of said carriage when said stepper motor means are de-energized; and (c) means for mounting said cam means on said carriage such that vertical force exerted on said probe is applied perpendicularly to said substrate.

* * * * *